US012796468B2

(12) United States Patent
Ko et al.

(10) Patent No.: US 12,796,468 B2
(45) Date of Patent: Nov. 10, 2026

(54) SEMICONDUCTOR PACKAGE INCLUDING DUMMY PACKAGE

(71) Applicant: SAMSUNG ELECTRONICS CO., LTD., Suwon-si (KR)

(72) Inventors: Byunghan Ko, Suwon-si (KR); Doil Kong, Suwon-si (KR); Hu Zhao, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 281 days.

(21) Appl. No.: 18/526,697

(22) Filed: Dec. 1, 2023

(65) Prior Publication Data

US 2024/0266248 A1 Aug. 8, 2024

(30) Foreign Application Priority Data

Feb. 6, 2023 (KR) ........................ 10-2023-0015716

(51) Int. Cl.
*H10W 40/25* (2026.01)
*H10B 80/00* (2026.01)
(Continued)

(52) U.S. Cl.
CPC .......... *H10W 40/258* (2026.01); *H10B 80/00* (2023.02); *H10W 70/611* (2026.01);
(Continued)

(58) Field of Classification Search
CPC ............. H10W 40/258; H10W 70/611; H10W 70/685; H10W 74/111; H10W 90/00; H10W 72/877; H10W 90/724; H10W 90/734; H10B 80/00; H10B 41/27; H10B 43/27; H01L 25/18; H01L 23/367; H01L 23/3736; H01L 23/42; H01L 25/105; H01L 23/02; H01L 23/49816; H01L 23/5286;
(Continued)

(56) References Cited

U.S. PATENT DOCUMENTS

| | | | |
|---|---|---|---|
| 8,717,762 | B2 | 5/2014 | Fujiwara |
| 9,865,567 | B1 | 1/2018 | Chaware et al. |

(Continued)

FOREIGN PATENT DOCUMENTS

| | | | |
|---|---|---|---|
| DE | 10 2020 131 263 A1 | 8/2021 |
| EP | 1 534 052 A2 | 5/2005 |
| KR | 10-1221019 B1 | 1/2013 |

OTHER PUBLICATIONS

Communication dated Jun. 7, 2024, issued by European Patent Office in European Patent Application No. 23215109.2.

*Primary Examiner* — Cuong B Nguyen
*Assistant Examiner* — Khatib A Rahman
(74) *Attorney, Agent, or Firm* — Sughrue Mion, PLLC

(57) ABSTRACT

The present disclosure provides semiconductor packages including dummy packages. In some embodiments, the semiconductor package includes a solid-state drive (SSD) device including a printed circuit board including a memory region, a plurality of memory packages disposed on the memory region, and at least one dummy package disposed on the memory region. The at least one dummy package is electrically coupled with the printed circuit board. The at least one dummy package includes a first pad constituting a heat path through which heat of the printed circuit board is dissipated.

20 Claims, 14 Drawing Sheets

(51) Int. Cl.

| | |
|---|---|
| ***H10W 70/60*** | (2026.01) |
| ***H10W 70/685*** | (2026.01) |
| ***H10W 72/00*** | (2026.01) |
| ***H10W 74/10*** | (2026.01) |
| ***H10W 90/00*** | (2026.01) |

(52) U.S. Cl.
CPC ........ *H10W 70/685* (2026.01); *H10W 74/111* (2026.01); *H10W 90/00* (2026.01); *H10W 72/877* (2026.01); *H10W 90/724* (2026.01); *H10W 90/734* (2026.01)

(58) Field of Classification Search
CPC . H01L 23/5386; H01L 24/15; H01L 25/0655; H01L 25/0657; H05K 1/0206; H05K 2201/2036; H05K 1/0209; H05K 1/181; H05K 3/3415; H05K 2201/066; H05K 2201/10159; H05K 2201/10204; H05K 2201/10545; H05K 2201/10734; H05K 2201/10969; H05K 2203/1572; H05K 1/0203; H05K 1/111
See application file for complete search history.

(56) References Cited

U.S. PATENT DOCUMENTS

| | | | | |
|---|---|---|---|---|
| 10,642,525 | B2 | 5/2020 | Bolkhovitin et al. | |
| 10,867,885 | B2 | 12/2020 | Yu et al. | |
| 10,937,749 | B2 | 3/2021 | Shih et al. | |
| 11,189,540 | B2 | 11/2021 | Wuu et al. | |
| 11,315,886 | B2 | 4/2022 | Choi et al. | |
| 11,393,807 | B2 | 7/2022 | Salmon | |
| 11,784,164 | B2 * | 10/2023 | Dokania | G11C 11/401 257/690 |
| 11,854,935 | B2 * | 12/2023 | Bertrand | H10W 40/22 |
| 11,915,996 | B2 * | 2/2024 | Sankman | H10W 40/22 |
| 2014/0124955 | A1 * | 5/2014 | Chen | H10W 40/70 257/777 |
| 2014/0301125 | A1 * | 10/2014 | Yoon | H05K 1/0253 174/262 |
| 2015/0098204 | A1 * | 4/2015 | Yoshikawa | H05K 1/144 361/767 |
| 2015/0351277 | A1 * | 12/2015 | Frank | H05K 9/0007 361/679.33 |
| 2015/0357275 | A1 * | 12/2015 | Jeon | G11C 5/063 361/748 |
| 2019/0067157 | A1 * | 2/2019 | Lin | H10P 54/00 |
| 2020/0075567 | A1 * | 3/2020 | Collins | G11C 29/04 |
| 2020/0303293 | A1 * | 9/2020 | Machida | H05K 1/113 |
| 2021/0305162 | A1 * | 9/2021 | Ganesan | H10P 72/74 |
| 2021/0320049 | A1 | 10/2021 | Suzuki et al. | |
| 2022/0102231 | A1 | 3/2022 | Modi et al. | |
| 2022/0132651 | A1 | 4/2022 | Lin et al. | |
| 2022/0217845 | A1 * | 7/2022 | Salmon | G06F 1/20 |
| 2026/0144162 | A1 * | 5/2026 | Hayashiguchi | H10W 72/071 |

* cited by examiner

SEMICONDUCTOR PACKAGE INCLUDING DUMMY PACKAGE

CROSS-REFERENCE TO RELATED APPLICATIONS

This application claims benefit of priority under 35 U.S.C. § 119 to Korean Patent Application No. 10-2023-0015716, filed on Feb. 6, 2023, in the Korean Intellectual Property Office, the disclosure of which is incorporated by reference herein in its entirety.

BACKGROUND

1. Field

The present disclosure relates generally to a semiconductor package, and more particularly, to a semiconductor package including a memory package and a dummy package.

2. Description of Related Art

Due to progress in the electronics industry and/or user demand, electronic devices may be becoming more compact and/or multi-functional. Alternatively or additionally, the electronic devices may have a greater capacity. As a result, the electronic devices may need semiconductor packages, which may include a plurality of semiconductor chips, in order to potentially meet increasing demands on size, functionality, and/or capacity. Accordingly, there exists a need for further improvements in semiconductor packages technology, as increasing demands on size, functionality, and/or capacity may be constrained by an ability of dissipating heat generated from the plurality of semiconductor chips.

SUMMARY

Aspects of the present disclosure provide for a semiconductor package including a dummy package that may constitute a heat path through which heat of a printed circuit board may be dissipated.

According to an aspect of the present disclosure, a semiconductor package is provided. The semiconductor package includes a solid-state drive (SSD) device including a printed circuit board including a memory region, a plurality of memory packages disposed on the memory region, and at least one dummy package disposed on the memory region. The at least one dummy package is electrically coupled with the printed circuit board. The at least one dummy package includes a first pad constituting a heat path through which heat of the printed circuit board is dissipated.

According to an aspect of the present disclosure, a semiconductor package is provided. The semiconductor package includes a printed circuit board including a first surface and a second surface opposite to the first surface, a dummy package mounted on the first surface, and a memory package aligned with the dummy package in a direction perpendicular to the first surface and the second surface and mounted on the second surface. The dummy package includes a first pad electrically coupled with the printed circuit board, and a metal layer electrically coupled with the first pad.

According to an aspect of the present disclosure, a semiconductor package is provided. The semiconductor package includes a printed circuit board including a first surface and a second surface opposite to the first surface, a dummy package mounted on the first surface, a memory package aligned with the dummy package in a direction perpendicular to the first surface and the second surface and mounted on the second surface, and a driving package mounted on at least one of the first surface and the second surface. A driving circuit configured to drive a memory chip of the memory package is formed on the at least one of the first surface and the second surface. The dummy package is electrically coupled with the printed circuit board through a bump. The dummy package includes a pad constituting a heat path through which heat of the printed circuit board is dissipated. The memory package includes a NAND flash memory device. The driving circuit of the driving package includes a storage controller configured to control the NAND flash memory device.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which.

DETAILED DESCRIPTION OF EMBODIMENTS

Figure 1A:
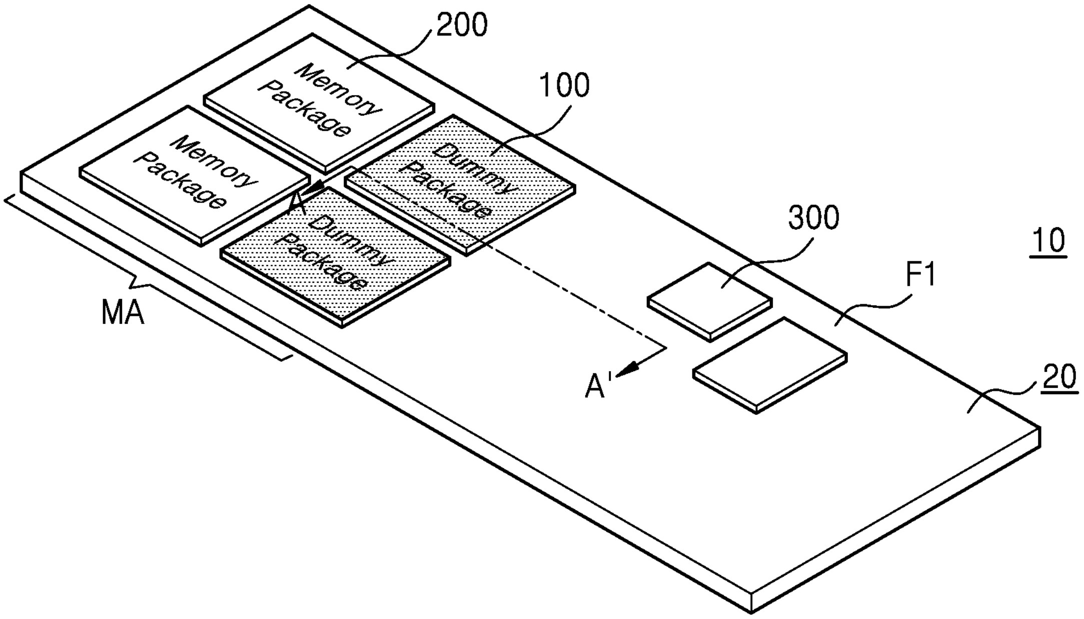
FIGS. 1A and 1B are schematic perspective views of a semiconductor package, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness. With regard to the description of the drawings, similar reference numerals may be used to refer to similar or related elements. In addition, repeated descriptions of similar or related elements may be omitted for the sake of brevity.

It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

As used herein, each of the terms "Ag", "Al", "Au", "Be", "Co", "Cu", "Ga", "In", "Mg", "Mn", "Mo", "Ni", "Re", "Ru", "SiN", "SiO", "Sn", "Ta", "Ti", "W", and the like may refer to a material made of elements included in each of the terms and is not a chemical formula representing a stoichiometric relationship.

The embodiments herein may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

Hereinafter, various embodiments of the present disclosure are described with reference to the accompanying drawings.

Hereinafter, various embodiments the present disclosure are described with reference to the accompanying drawings.

Figure 1B:
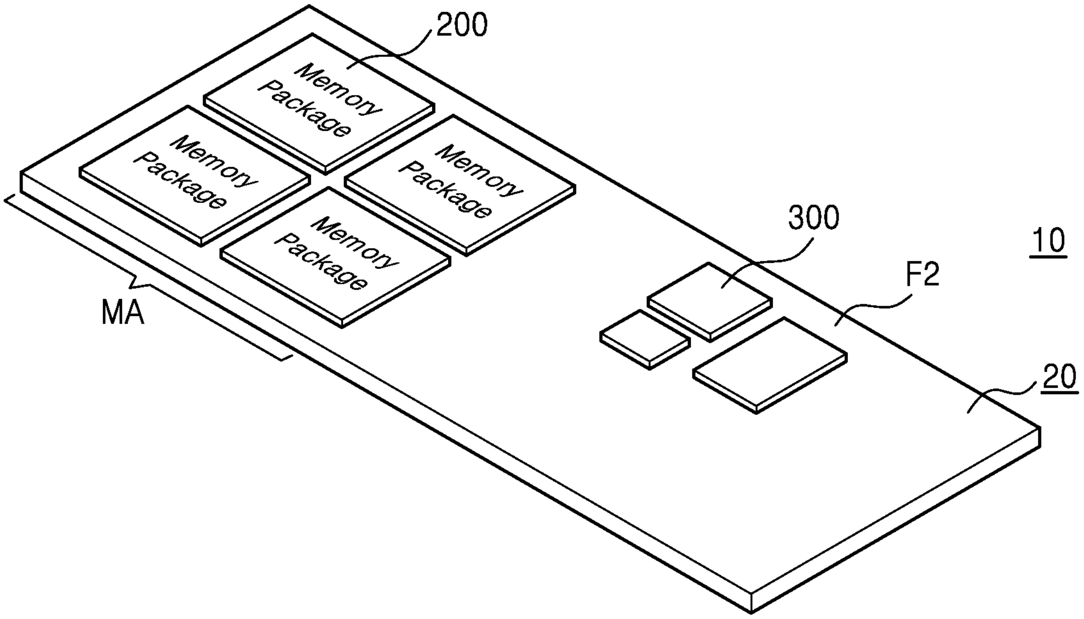

FIGS. 1A and 1B are schematic perspective views of a structure of a semiconductor package 10, according to an embodiment.

Referring to FIGS. 1A and 1B, the semiconductor package 10 may include a printed circuit board 20, a plurality of memory packages 200, and at least one dummy package 100. Alternatively or additionally, the semiconductor package 10 may include a plurality of driving chip packages 300 configured to drive each memory package of the plurality of memory packages 200.

The printed circuit board 20 may include a memory region MA in which the plurality of memory packages 200 may be mounted. Alternatively or additionally, the plurality of driving chip packages 300 may be mounted in a region outside the memory region MA.

As shown in FIGS. 1A and 1B, the printed circuit board 20 may include a first surface F1 and a second surface F2 opposite to the first surface F1. The plurality of memory packages 200 may be mounted in the memory region MA on the first surface F1 and on the second surface F2 of the printed circuit board 20. The memory region MA of the first surface F1 and the memory region MA of the second surface F2 may be aligned with each other in a direction perpendicular to the first surface F1 and the second surface F2.

At least one dummy package 100 may be mounted in the memory region MA of the first surface F1 and/or the memory region MA of the second surface F2. The at least one dummy package 100 may be mounted in a portion of the memory region MA in which the plurality of memory packages 200 are not mounted. In an embodiment, the area occupied by the at least one dummy package 100 on the printed circuit board 20 may be substantially similar and/or may be the same as the area of each memory package of the plurality of memory packages 200. That is, the size of the dummy package 100 may be substantially similar and/or may be the same as (e.g., match) the size of a memory package of the plurality of memory packages 200. For example, two dummy packages 100, each having the same and/or a substantially similar size as that of the memory package 200, may be mounted in the memory region MA of the first surface F1. Alternatively or additionally, a dummy package 100 mounted on the first surface F1 may be aligned with a memory package 200 mounted on the second surface F2 in the direction perpendicular to the first surface F1 and the second surface F2.

However, the semiconductor package 10 according to the present disclosure is not limited thereto, and the size of the dummy package 100 may be greater than and/or smaller than the size of the memory package 200. In an embodiment, a dummy package 100 having a size smaller than that of the memory package 200 may be mounted in a region in which a memory package 200 is mounted. For example, a plurality of dummy packages 100 may be mounted in a region in which one memory package 200 is mounted. Alternatively or additionally, the plurality of dummy packages 100 may be aligned with the region in which the memory package 200 is mounted in the direction perpendicular to the first surface F1 and the second surface F2. In an optional or additional embodiment, a dummy package 100 having a size greater than that of the memory package 200 may be mounted in a region in which the plurality of memory packages 200 are mounted. For example, a dummy package 100 may be mounted in a region in which a plurality of memory packages 200 are mounted. Alternatively or additionally, the dummy package 100 may be aligned with the region in which the plurality of memory packages 200 are mounted in the direction perpendicular to the first surface F1 and the second surface F2.

The number of dummy packages 100 included in the semiconductor package 10 may vary according to the overall memory capacity of the semiconductor package 10 and/or according to design constraints. For example, the number of memory packages 200 mounted in the memory region MA may decrease as the memory capacity needed by the semiconductor package 10 decreases. Alternatively or additionally, the number of dummy packages 100 mounted in the memory region MA instead of the memory package 200 may increase as the memory capacity needed by the semiconductor package 10 decreases. However, the present disclosure is not limited in this regard. For example, in an embodiment, the number of dummy packages 100 mounted in the memory region MA instead of the memory package 200 may decrease as the memory capacity needed by the semiconductor package 10 decreases The dummy package 100 may be electrically connected (e.g., coupled) with the printed circuit board 20 through a plurality of bumps. Accordingly, the dummy package 100 may provide a heat path through which heat generated in the memory package 200 may be dissipated. Alternatively or additionally, the dummy package 100 may provide a heat path through which heat generated in the driving chip package 300 may be dissipated. In an embodiment, heat generated inside the semiconductor package 10 may be dissipated to outside of the semiconductor package 10 through the dummy package 100.

The memory package 200 may be and/or may include a non-volatile memory device, such as, but not limited to, a NAND flash memory device. In an embodiment, the semiconductor package 10 may be a storage device. Alternatively or additionally, the semiconductor package 10 may be and/or may include a solid-state drive (SSD). However, the present disclosure is not limited thereto. For example, in some embodiments, the memory package 200 may be and/or may include a memory device such as, but not limited to, a resistive memory device such as a resistive RAM (ReRAM)), a phase-change RAM (PRAM), a magnetoresistive RAM (MRAM), and the like.

The driving chip package 300 may be and/or may include driving circuits for driving a NAND flash memory device. For example, each driving chip package of the plurality of driving chip packages 300 may be and/or may include a storage controller that may control the operation of a memory device such as, but not limited to, a NAND flash memory device, a buffer memory (e.g., a dynamic random-access memory (DRAM)), a power management integrated circuit (PMIC), and the like.

Figure 2:
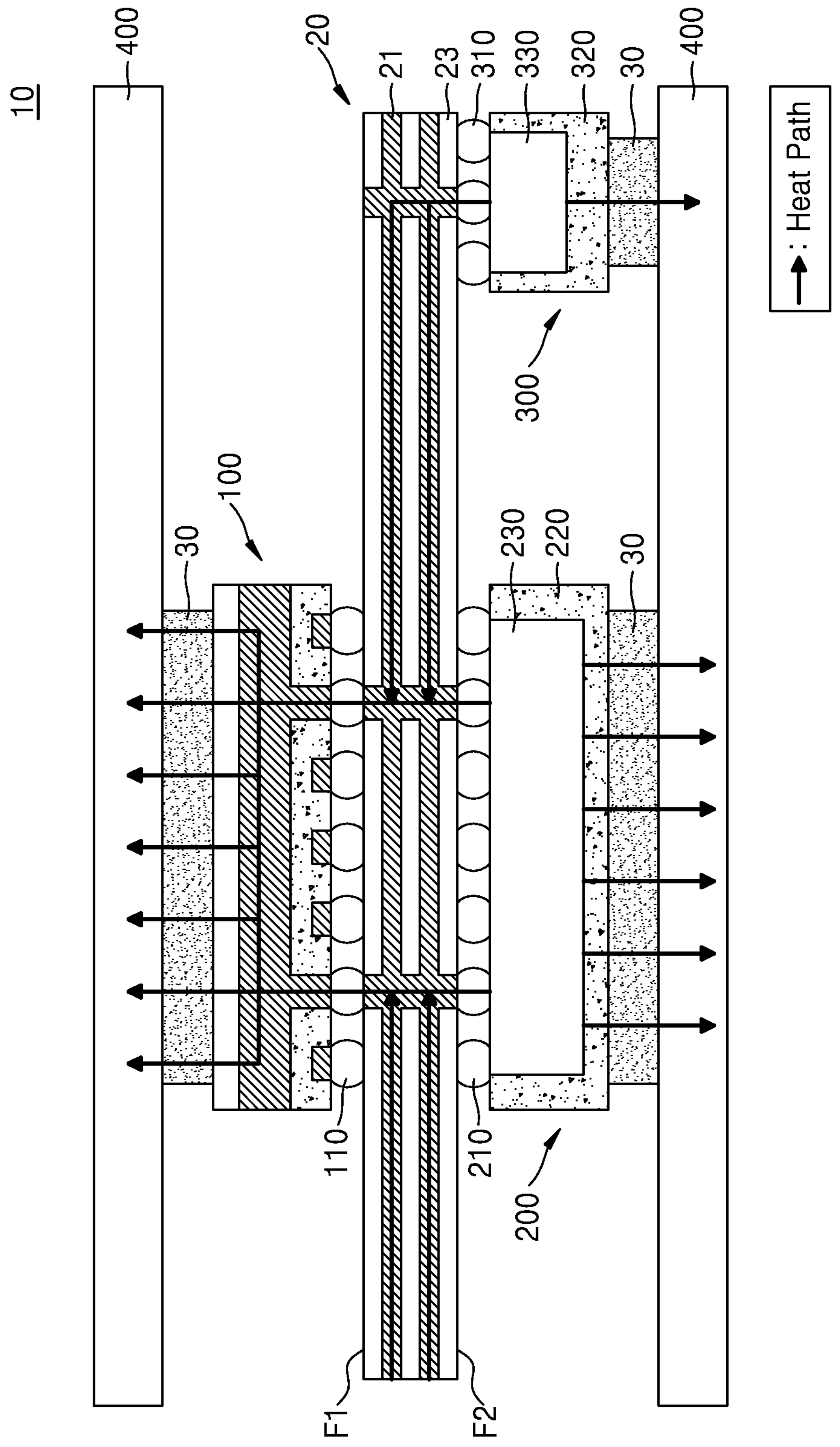
FIG. 2 is a cross-sectional view of the semiconductor package taken along line A-A' of FIG. 1A, according to an embodiment.
Figure 3:
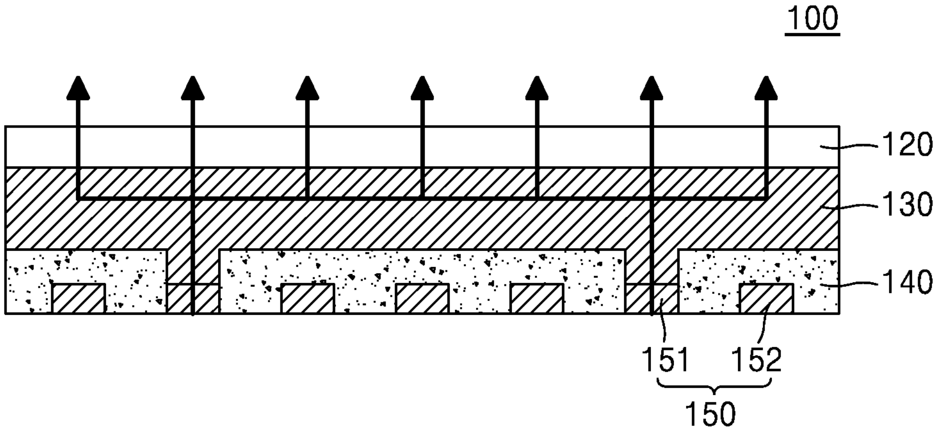
FIG. 3 is a cross-sectional view of a dummy package of FIG. 2, according to an embodiment.

FIG. 2 is a cross-sectional view of the semiconductor package 10 taken along line A-A' of FIG. 1A, according to an embodiment. FIG. 3 is a cross-sectional view of the dummy package 100 of FIG. 2, according to an embodiment. FIG. 2 is a diagram depicting a structure of a semiconductor package 10 and a heat path which is a heat dissipation path of the semiconductor package 10, according to an embodiment.

Referring to FIGS. 2 and 3, the semiconductor package 10 may include the printed circuit board 20, the memory package 200, the dummy package 100, the driving chip package 300, an adhesive layer 30, and a package case 400. For example, the dummy package 100 may be mounted on the first surface F1 of the printed circuit board 20 through a plurality of first bumps 110. Alternatively or additionally, the memory package 200 may be mounted on the second surface F2 of the printed circuit board 20 through a plurality of second bumps 210. In an embodiment, the dummy package 100 and the memory package 200 may have a substantially similar size and/or may the same size. Alternatively or additionally, the dummy package 100 and the memory package 200 may be aligned with each other in a direction perpendicular to a main surface (e.g., the first surface F1 and/or the second surface F2) of the printed circuit board 20. In an optional or additional embodiment, the number of the plurality of first bumps 110 connected with the dummy package 100 may be the same as (e.g., match) the number of the plurality of second bumps 210 connected with the memory package 200. However, the semiconductor package 10 according to the present disclosure is not limited thereto. For example, in an embodiment, the number of the plurality of first bumps 110 may not match the number of the plurality of second bumps 210.

In an embodiment, the driving chip package 300 may be mounted on the second surface F2 of the printed circuit board 20 through a plurality of third bumps 310. However, the present disclosure is not limited in this regard. For example, the driving chip package 300 may be mounted on the first surface F1 of the printed circuit board 20 through the plurality of third bumps 310. Each bump of the plurality of first bumps 110, the plurality of second bumps 210, and the plurality of third bumps 310 may have a structure including a pillar and/or a solder. However, the present disclosure is not limited in this regard. For example, according to an optional or additional embodiment, each bump of the plurality of first bumps 110, the plurality of second bumps 210, and the plurality of third bumps 310 may include only a solder.

The dummy package 100, the memory package 200, and the driving chip package 300 may be coupled to the package case 400 through the adhesive layer 30. In an embodiment, the package case 400 may be configured to protect internal components of the semiconductor package 10. Alternatively or additionally, the package case 400 may be formed to surround the internal components.

The adhesive layer 30 may be formed of a high-thermal-conductivity material such that heat may be dissipated. For example, the adhesive layer 30 may include a thermal interface material (TIM). The TIM may be formed of a material having high thermal conductivity (e.g., a low thermal resistance) such as, but not limited to, grease, tape, an elastomer filling pad, a phase transition material, and the like. However, the present disclosure is not limited in this regard, and the material of the TIM may not be limited to the materials described above.

As shown in FIG. 3, the dummy package 100 may include a plurality of pads 150, a metal layer 130, and a polished layer 120. Each pad of the plurality of pads 150 may be in contact with a corresponding bump from among the plurality of first bumps 110.

The plurality of pads 150 may include at least one first pad 151 and at least one second pad 152. The first pad 151 may be electrically connected (e.g., coupled) with the metal layer 130. The second pad 152 may be surrounded by a molding layer 140. Alternatively or additionally, the second pad 152 may be electrically separated from the metal layer 130.

The metal layer 130 may be and/or may include a low-thermal-conductivity material to constitute a heat path for heat dissipation. For example, the metal layer 130 may include, but not be limited to, copper (Cu), aluminum (Al), and the like.

The polished layer 120 formed on the metal layer 130 may be formed by polishing the metal layer 130 to minimize interfacial resistance so as to facilitate adhesion with the adhesive layer 30.

Continuing to refer to FIGS. 2 and 3, in an embodiment, the first pad 151 may constitute a heat path and/or may be electrically connected with a wiring pattern 21 of the printed circuit board 20. Alternatively or additionally, the second pad 152 may be electrically separated from the wiring pattern 21 of the printed circuit board 20.

The memory package 200 may include a memory chip 230 and a molding layer 220 surrounding the memory chip 230. The driving chip package 300 may include a driving chip 330 and a molding layer 320 surrounding the driving chip 330. Alternatively or additionally, the molding layer 140 of the dummy package 100, the molding layer 220 of the memory package 200, and the molding layer 320 of the driving chip package 300 may be formed of a resin such as, but not limited to, an epoxy molding compound (EMC).

The printed circuit board 20 may include the wiring pattern 21. In an embodiment, the wiring pattern 21 may include a line pattern extending from the inside of the printed circuit board 20 in a horizontal direction. Alternatively or additionally, the wiring pattern 21 may include a via pattern extending from the inside of the printed circuit board 20 in a vertical direction that may be connected with the line pattern. In an optional or additional embodiment, the printed circuit board 20 may include an insulating layer 23 that may insulate the wiring pattern 21 from other patterns.

The material of the wiring pattern 21, according to an embodiment, may be and/or may include copper (Cu). However, the present disclosure is not limited thereto, and the material of the wiring pattern 21 may be and/or may include, but not be limited to, nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), and/or an alloy thereof.

In an embodiment, a ground voltage may be applied to the wiring pattern 21 that may constitute a heat path. In an optional or additional embodiment, the wiring pattern 21 may be electrically separated from input/output signals of the memory package 200. Alternatively or additionally, the wiring pattern 21 may be electrically separated from input/output signals of the driving chip package 300. That is, the wiring pattern 21 may include wiring that is not used for signal and/or power transmission in the printed circuit board 20 and/or that may be used as a heat path. Alternatively or additionally, the wiring pattern 21 may include wiring that may not affect other signals although the wiring is not used for signal or power transmission and/or that may be used as a heat path.

The memory chip 230 may be act as a heat source that may generate heat inside the semiconductor package 10. For example, heat generated in the memory chip 230 of the memory package 200 may be dissipated to the outside of the semiconductor package 10 through a heat path that may be constituted by the molding layer 220 of the memory package 200, the adhesive layer 30, and the package case 400. Alternatively or additionally, heat generated in the memory chip 230 may be dissipated to the outside of the semiconductor package 10 through a heat path that may be constituted by the second bump 210, the wiring pattern 21 of the printed circuit board 20, the first bump 110, the first pad 151 of the dummy package 100, the metal layer 130 of the dummy package 100, the polished layer 120 of the dummy package 100, the adhesive layer 30, and the package case 400. That is, the dummy package 100 may provide a heat path through which heat generated in the memory package 200 may be dissipated.

Alternatively or additionally, the driving chip 330 may act as a heat source that may generate heat inside the semiconductor package 10. For example, the driving chip 330 of the driving chip package 300 may be implemented as a PMIC and/or a voltage regulator, and/or may be configured to provide a power voltage for driving a memory device implemented in the memory chip 230 and/or a storage controller. In an embodiment, heat generated in the driving chip 330 of the driving chip package 300 may be dissipated to the outside of the semiconductor package 10 through a heat path that may be constituted by the molding layer 320 of the driving chip package 300, the adhesive layer 30, and the package case 400. Alternatively or additionally, heat generated in the driving chip 330 may be dissipated to the outside of the semiconductor package 10 through a heat path that may be constituted by the third bump 310, the wiring pattern 21 of the printed circuit board 20, the first bump 110, the first pad 151 of the dummy package 100, the metal layer 130 of the dummy package 100, the polished layer 120 of the dummy package 100, the adhesive layer 30, and the package case 400. That is, the dummy package 100 may provide a heat path through which heat generated in the driving chip package 300 is dissipated.

When the EMC constituting the molding layer 140 of the dummy package 100, the molding layer 220 of the memory package 200, and the molding layer 320 of the driving chip package 300 have a relatively low thermal conductivity (e.g., about 0.8 Watts per meter Kelvin (W/mk)), dissipation of heat generated in the memory chip 230 and the driving chip 330 may not be relatively smooth. For example, a bottleneck phenomenon may occur in the heat path due to the molding layers 220 and 320 of the EMC.

The semiconductor package 10, according to the present disclosure, may include the dummy package 100 that may provide an additional heat path. For example, the dummy package 100 may include the metal layer 130 having a relatively high thermal conductivity material (e.g., copper (Cu) having about 385 W/mK and/or aluminum (Al) having about 200 W/mK), such that heat generated in the memory package 200 and the driving chip package 300 may be smoothly dissipated to the outside of the semiconductor package 10 through the dummy package 100. Since an excessive increase in temperature of the memory chip 230 and the driving chip 330 may be prevented, deterioration of the performance of the memory chip 230 and the driving chip 330 may be prevented as a result.

Figure 4A:
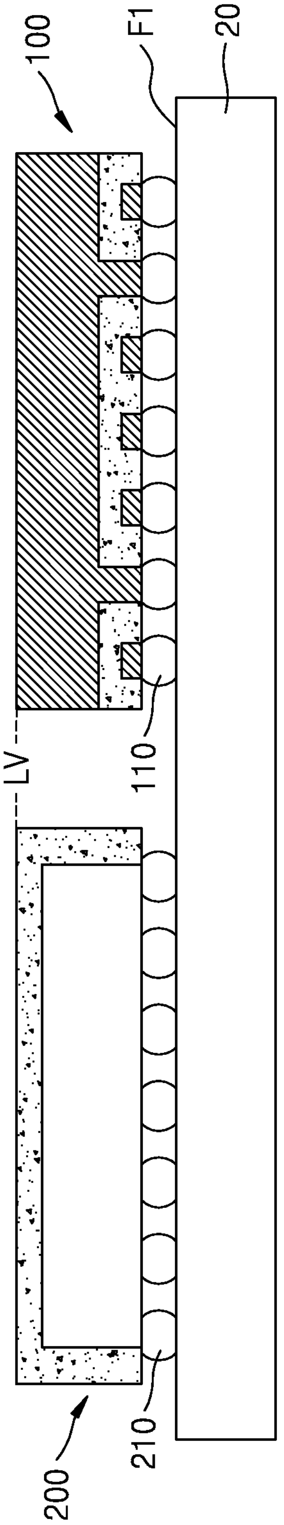
FIGS. 4A to 4C are cross-sectional views showing a method of manufacturing a semiconductor package, according to an embodiment.
Figure 4B:
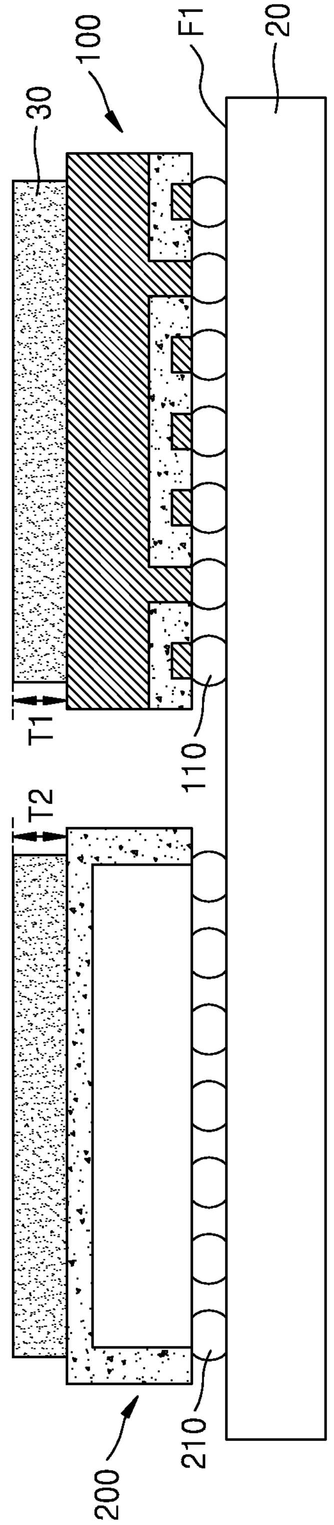
Figure 4C:
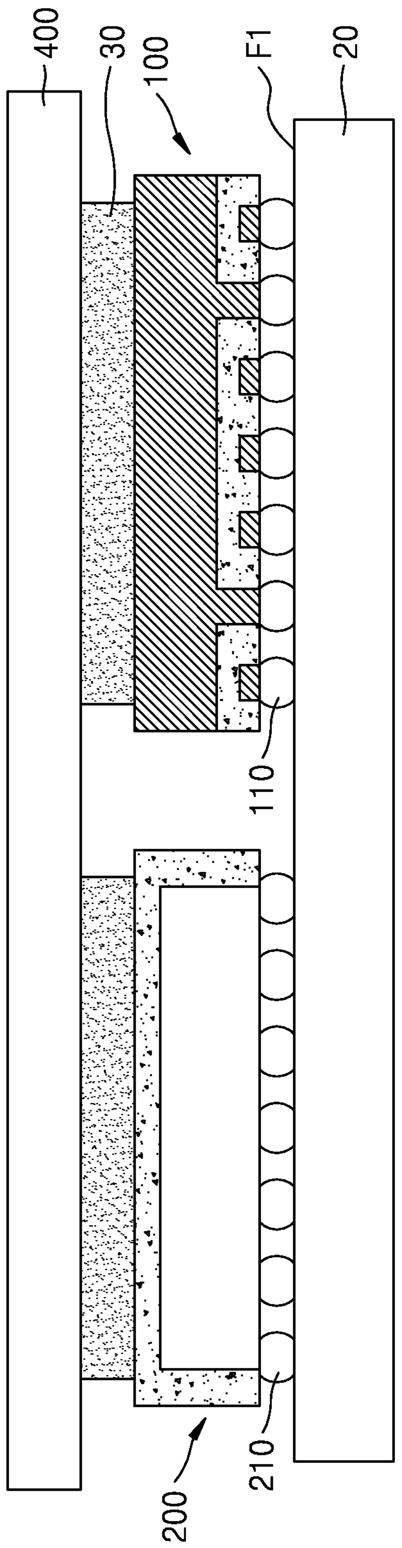

FIGS. 4A to 4C are cross-sectional views showing a method of manufacturing the semiconductor package 10, according to an embodiment. In FIGS. 4A to 4C, the memory package 200 and the dummy package 100, disposed on the first surface F1 of the printed circuit board 20, are mainly described as an example.

Referring to FIG. 4A, the printed circuit board 20 including the first surface F1 may be prepared. The memory package 200 and the dummy package 100 may be mounted on the memory region MA of the first surface F1 of the printed circuit board 20 through the plurality of first bumps 110 and the plurality of second bumps 210. In an embodiment, the memory package 200 and the dummy package 100 may be mounted together on the printed circuit board 20 in the same process. That is, in such an embodiment, the memory package 200 and the dummy package 100 may be mounted on the printed circuit board 20 at a substantially similar and/or the same time.

In an optional or additional embodiment, the memory package 200 and the dummy package 100 may occupy a substantially similar and/or the same size area on the printed circuit board 20 and/or may have a substantially similar and/or the same size. Alternatively or additionally, a level LV of an upper surface of the dummy package 100 and the level LV of an upper surface of the memory package 200 may be substantially similar and/or may be the same. For example, a vertical height of the memory package 200 from the first surface F1 of the printed circuit board 20 may be substantially similar and/or the same as a vertical height of the dummy package 100 from the first surface F1 of the printed circuit board 20.

Referring to FIG. 4B, the adhesive layer 30 may be formed on each of the memory package 200 and the dummy package 100. The adhesive layer 30 having a first thickness T1 may be formed on the dummy package 100, and the adhesive layer 30 having a second thickness T2 may be formed on the memory package 200. In an embodiment, the first thickness T1 and the second thickness T2 may be substantially similar and/or may be the same. For example, the height of the upper surface of the dummy package 100 from the printed circuit board 20 may be substantially similar and/or the same as the height of the upper surface of the memory package 200 from the printed circuit board 20. Alternatively or additionally, the adhesive layer 30 having a substantially similar and/or the same height may be formed without the need to separate forming the adhesive layer 30 on the memory package 200 and forming the adhesive layer 30 on the dummy package 100. That is, the adhesive layer 30 on the dummy package 100 and the adhesive layer 30 on the memory package 200 may be formed at a substantially similar and/or the same time.

Referring to FIG. 4C, the package case 400 attached to the adhesive layer 30 may be formed. For example, the package case 400 may be disposed on the adhesive layer 30 of the dummy package 100 and the adhesive layer 30 of the memory package 200.

In an embodiment of manufacturing a semiconductor package 10 having a relatively low memory capacity, according to the present disclosure, heat dissipation of the semiconductor package 10 may be increased by arranging the dummy package 100 instead of the memory package 200 in a semiconductor region (e.g., region MA of FIG. 1A) of the printed circuit board 20. Alternatively or additionally, the adhesive layer 30 on the dummy package 100 and the memory package 200 may be formed with a uniform thickness in a simplified manner that may further improve heat dissipation performance.

Figure 5:
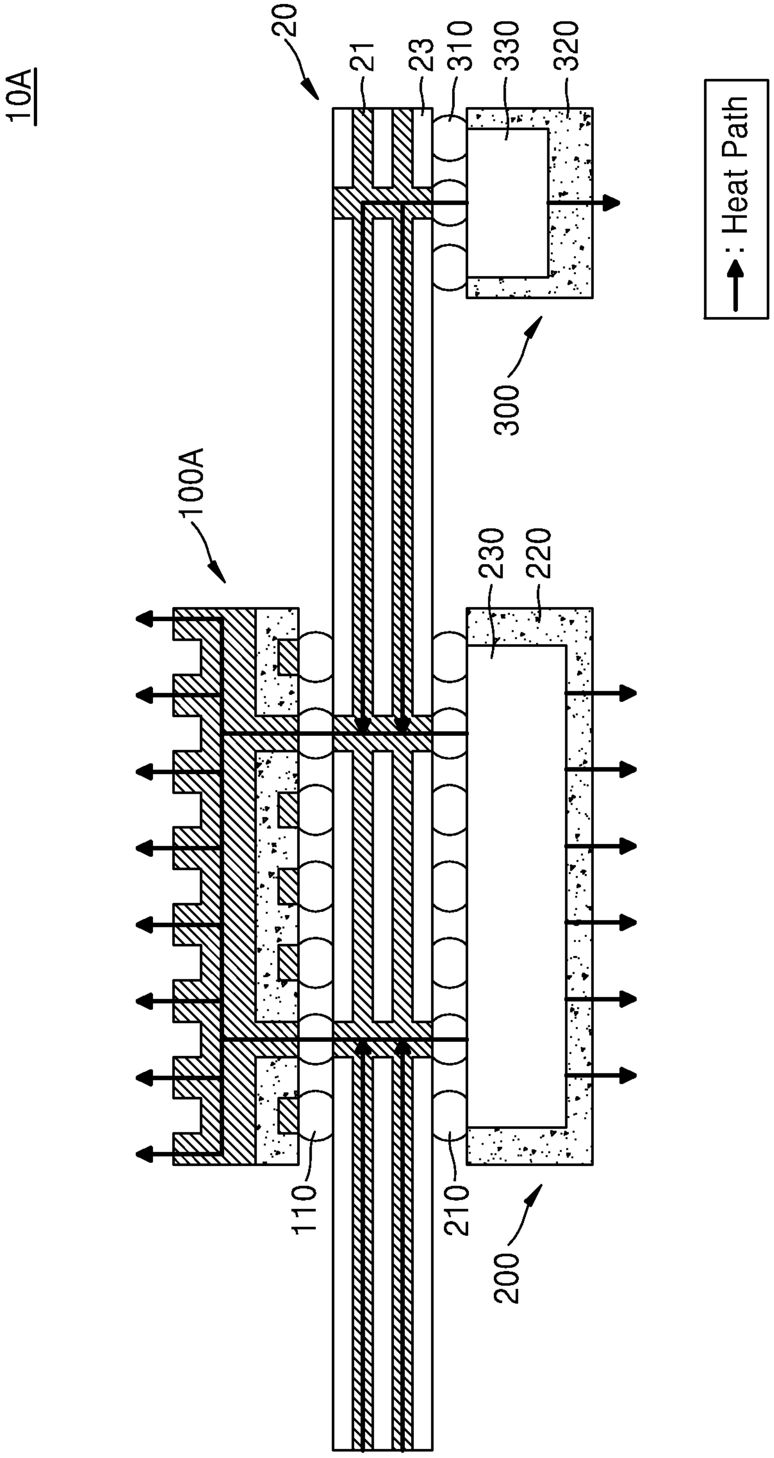
FIG. 5 is a cross-sectional view of the semiconductor package taken along line A-A' of FIG. 1A, according to an embodiment.
Figure 6:
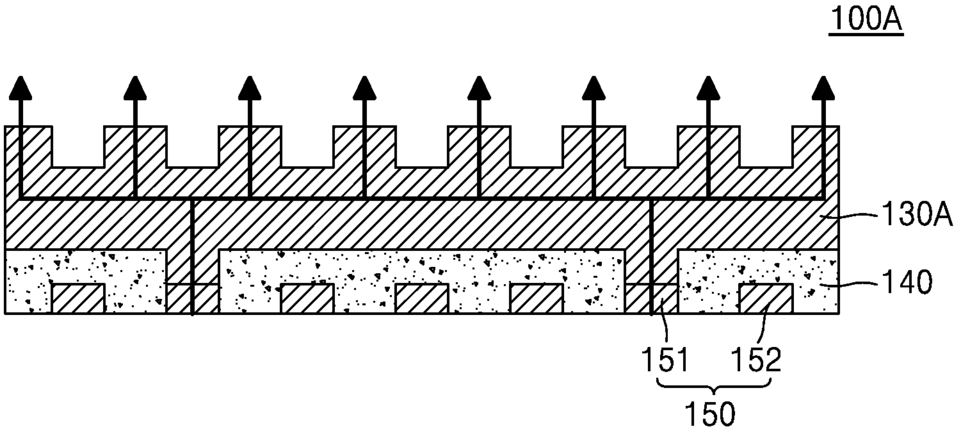
FIG. 6 is a cross-sectional view of a dummy package of FIG. 5, according to an embodiment.

FIG. 5 is a cross-sectional view of the semiconductor package 10A taken along line A-A' of FIG. 1A, according to an embodiment. FIG. 6 is a cross-sectional view of a dummy package 100A of FIG. 5. FIG. 5 is a diagram illustrating a structure of a semiconductor package 10A and a heat dissipation path of the semiconductor package 10A, according to an embodiment. The semiconductor package 10A of FIG. 5 may include or may be similar in many respects to the semiconductor package 10 described above with reference to FIG. 2, and may include additional features not mentioned above. Furthermore, the dummy package 100A of FIGS. 5 and 6 may include or may be similar in many respects to dummy package 100 described above with reference to FIGS. 2 and 3, and may include additional features not mentioned above. Thus, redundant descriptions thereof may be omitted.

Referring to FIGS. 5 and 6, compared to the semiconductor package 10 of FIG. 2, a semiconductor package 10A may not include a package case (e.g., package case 400 of FIG. 2). The semiconductor package 10A may include the printed circuit board 20, the memory package 200, the dummy package 100A, and the driving chip package 300. For example, the dummy package 100A may be mounted on the first surface F1 of the printed circuit board 20 through the plurality of first bumps 110. Alternatively or additionally, the memory package 200 may be mounted on the second surface F2 of the printed circuit board 20 through the plurality of second bumps 210. The dummy package 100A and the memory package 200 may have a substantially similar size and/or have the same size. Alternatively or additionally, the dummy package 100A and the memory package 200 may be aligned with each other in a direction perpendicular to a main surface (e.g., the first surface F1 and/or the second surface F2) of the printed circuit board 20.

In an embodiment, the dummy package 100A, the memory package 200, and the driving chip package 300 may be exposed to air (e.g., the outside). Consequently, heat generated in the memory package 200 and the driving chip package 300 may be dissipated to the outside of the semiconductor package 10A according to the flow of air to the dummy package 100A, the memory package 200, and the driving chip package 300.

The dummy package 100A may include a plurality of pads 150 and a metal layer 130A. The plurality of pads 150 may include the first pad 151 and the second pad 152. The first pad 151 may be electrically connected with the metal layer 130A. The second pad 152 may be surrounded by the molding layer 140 and may be electrically separated from the metal layer 130A.

The first pad 151 may constitute a heat path and/or may be electrically connected with the wiring pattern 21 of the printed circuit board 20. Alternatively or additionally, the second pad 152 may be electrically separated from the wiring pattern 21 of the printed circuit board 20.

In an embodiment, the metal layer 130A may have a heat sink structure. The heat sink structure may refer to a structure that may be specialized in heat conduction and radiation in order to facilitate heat dissipation. For example, the heat sink structure may have a repeating ridge-groove shape on a surface (e.g., a surface opposite to a surface facing the printed circuit board 20), through which heat may be dissipated, in order to increase the surface area of the heat sink structure.

The metal layer 130A may include a low-thermal-conductivity material to constitute a heat path for heat dissipation. For example, the metal layer 130A may include, but not be limited to, copper (Cu) or aluminum (Al).

In an embodiment, heat generated in the memory chip 230 of the memory package 200 may be dissipated to the outside of the semiconductor package 10A through a heat path that may be constituted by the molding layer 220 of the memory package 200, the adhesive layer 30, and the package case 400. Alternatively or additionally, heat generated in the memory chip 230 may be dissipated to the outside of the semiconductor package 10A through a heat path that may be constituted by the second bump 210, the wiring pattern 21 of the printed circuit board 20, the first bump 110, the first pad 151 of the dummy package 100A, and the metal layer 130A of the dummy package 100A.

In an optional or additional embodiment, heat generated in the driving chip 330 of the driving chip package 300 may be dissipated to the outside of the semiconductor package 10A through a heat path that may be constituted by the molding layer 320 of the driving chip package 300, the adhesive layer 30, and the package case 400. Alternatively or additionally, heat generated in the driving chip 330 may be dissipated to the outside of the semiconductor package 10A through a heat path that may be constituted by the third bump 310, the wiring pattern 21 of the printed circuit board 20, the first bump 110, the first pad 151 of the dummy package 100A, and the metal layer 130A of the dummy package 100A.

That is, the dummy package 100A may provide a heat path through which heat generated in the memory package 200 and the driving chip package 300 may be dissipated. Since the semiconductor package 10A, according to the present disclosure, may include the dummy package 100A that may provide an additional heat path, heat generated in the memory package 200 and the driving chip package 300 may be smoothly dissipated to the outside of the semiconductor package 10A.

Figure 7A:
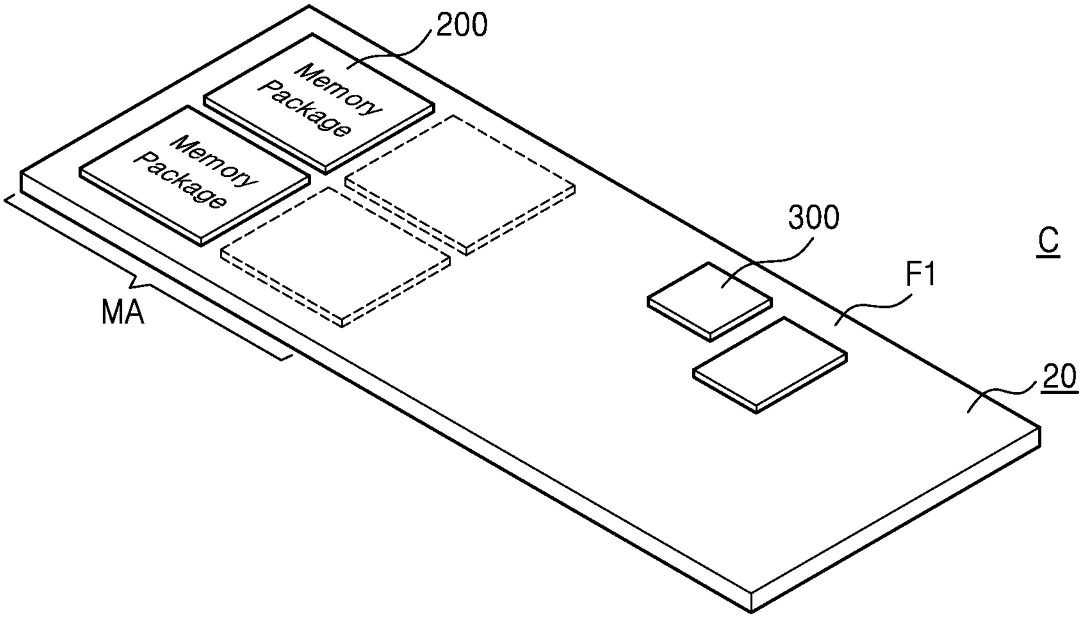
FIG. 7A is a perspective view showing a schematic structure of a semiconductor package, according to an embodiment.
Figure 7B:
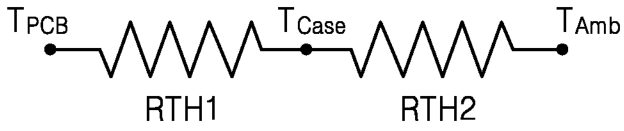
FIGS. 7B and 7C are diagrams illustrating effects of semiconductor packages, according to an embodiment.
Figure 7B:
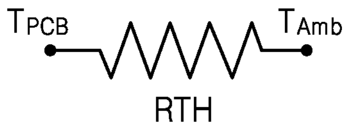
Figure 7C:
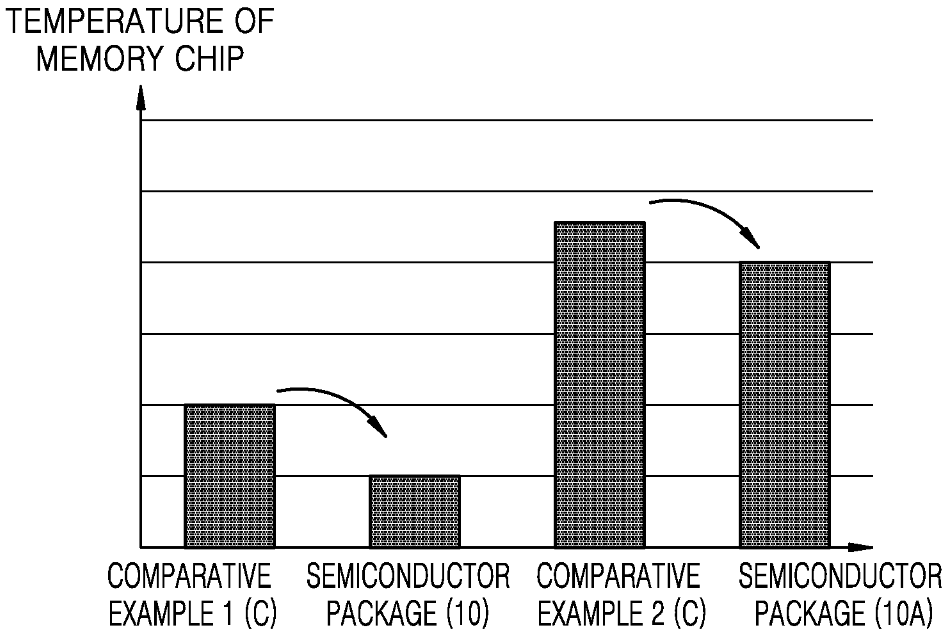

FIG. 7A is a perspective view showing a schematic structure of a semiconductor package C, according to an embodiment. FIGS. 7B and 7C are diagrams illustrating effects of semiconductor packages 10 and 10A, according to an embodiment. FIG. 7B is a diagram depicting the thermal resistance of a semiconductor package according to an embodiment. FIG. 7C is a diagram depicting an experimental result of comparing the temperature of a memory chip of the comparative example with the temperature of a memory chip of an embodiment. The semiconductor package C of FIG. 7A may include or may be similar in many respects to at least one of the semiconductor package 10 and the semiconductor package 10A described above with reference to FIGS. 1A, 1B, 2, and 5, and may include additional features not mentioned above. Thus, redundant descriptions thereof may be omitted.

Referring to FIG. 7A, compared to the semiconductor packages 10 and 10A of FIGS. 1A, 1B, 2, and 5, the semiconductor package C may not include a dummy package mounted in a region in which a memory package is not mounted. That is, in the semiconductor package C, a specific package may not be mounted in a region in which a memory package is not mounted. As a result, a heat path may not be formed through a dummy package (e.g., dummy package 100 of FIG. 3 and dummy package 100A of FIG. 5) in the semiconductor package C.

Referring to FIG. 7B, the thermal resistance of the semiconductor package 10, including a package case (e.g., package case 400 of FIG. 3), may be calculated as the sum of a first thermal resistance RTH1 between a temperature $T_{PCB}$ of a printed circuit board (e.g., printed circuit board 20 of FIG. 3) and a temperature $T_{Case}$ of a package case (e.g., package case 400 of FIG. 3) and a second thermal resistance RTH2 between the temperature $T_{Case}$ of the package case 400 and an external temperature $T_{Amb}$ (e.g., RTH1+RTH2). In an embodiment, generation of a heat path by the dummy package 100 may reduce the magnitude of the first thermal resistance RTH1, and thereby, the overall thermal resistance of the semiconductor package 10 may be reduced.

Alternatively or additionally, the thermal resistance of the semiconductor package 10A not including a package case may be calculated as a thermal resistance RTH between the temperature $T_{PCB}$ of a printed circuit board (e.g., printed circuit board 20 of FIG. 5) and the external temperature $T_{Amb}$. In an embodiment, generation of a heat path by the dummy package 100A may reduce the magnitude of the thermal resistance RTH, and thereby, the overall thermal resistance of the semiconductor package 10A may be reduced. Consequently, the overall thermal resistance of the semiconductor packages 10 and 10A may be lower than the overall thermal resistance of the semiconductor package C, due to the dummy packages 100 and 100A included in the semiconductor packages 10 and 10A but omitted in the semiconductor package C.

Consequently, as shown in FIG. 7C, the temperature of a memory chip 230 in the memory package 200 of the semiconductor package C, which may include a package case (Comparative Example 1), may be higher than the temperature of a corresponding memory chip 230 of the semiconductor package 10, due to the reduced thermal resistance and increased heat dissipation efficiency of the semiconductor package 10 when compared to the semiconductor package C. Alternatively or additionally, the temperature of the memory chip 230 in the semiconductor package C, which may not include a package case (Comparative Example 2), may be higher than the temperature of a corresponding memory chip 230 of the semiconductor package 10A, due to the reduced thermal resistance and increased heat dissipation efficiency of the semiconductor package 10A when compared to the semiconductor package C. Therefore, according to the present disclosure, performance deterioration of the memory chip 230 in the semiconductor packages 10 and 10A due to excessive heat may be reduced and/or prevented.

In an optional or additional embodiment, an adhesive layer 30 of the semiconductor package C, which may be attached to a package case, may formed in a region in which the memory package 200 is not arranged in order to increase heat dissipation efficiency. However, in such an embodiment, the thickness of the adhesive layer 30 of the semiconductor package C formed on the memory package 200 of the semiconductor package C may be different from the thickness of the adhesive layer 30 of the semiconductor package C formed in the region in which the memory package 200 is not arranged. Consequently, a process for forming the adhesive layer with an uniform thickness may be complicated, and thus, the heat dissipation effect of the adhesive layer 30 of the semiconductor package C may be reduced. Alternatively or additionally, since the semiconductor packages 10 and 10A may respectively include the dummy packages 100 and 100A, an adhesive layer 30 having a uniform thickness may be formed, and thus, a process for forming the adhesive layer may be simplified and heat dissipation performance may be improved when compared to the semiconductor package C.

Figure 8:
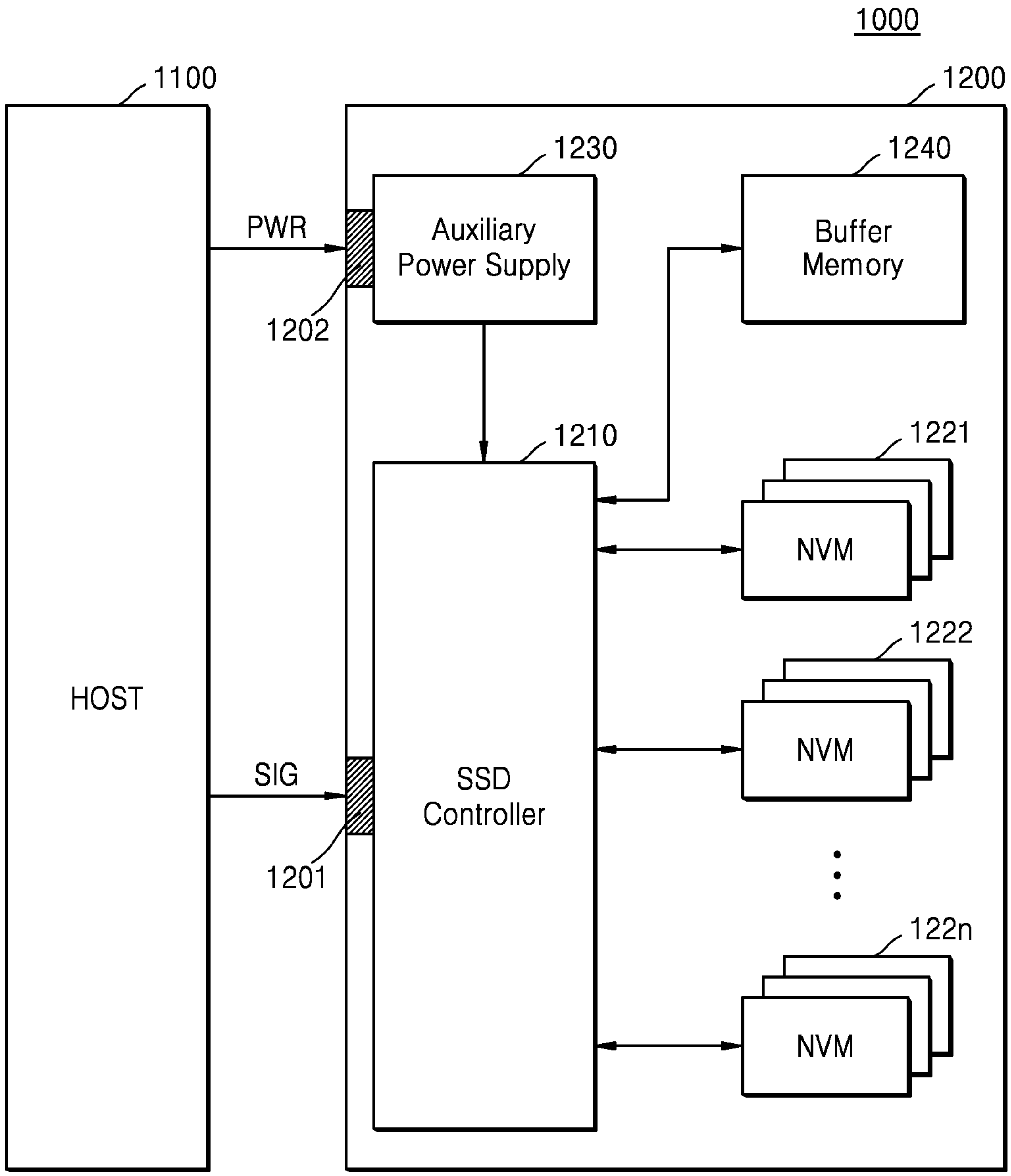
FIG. 8 is a block diagram of a storage system, according to an embodiment.

FIG. 8 is a block diagram of a storage system 1000, according to an embodiment.

The storage system 1000 may be implemented as, for example, a personal computer (PC), a data server, a network-attached storage (NAS), an Internet of Things (IoT) device, and/or a portable electronic device. The portable electronic device may be and/or may include a laptop computer, a mobile phone, a tablet PC, a personal digital assistant (PDA), an enterprise digital assistant (EDA), a digital still camera, a digital video camera, an audio device, a portable multimedia player (PMP), a personal navigation device (PND), a Motion Pictures Expert Group Audio Layer III (MP3) player, a handheld game console, an e-book, a wearable device, and the like. However, the present disclosure is not limited in this regard, and the storage system 1000 may be implemented as various other devices not listed above.

Referring to FIG. 8, the storage system 1000 may include a storage device 1200 and a host 1100. The host 1100 may control the operation of the storage device 1200. In an embodiment, the storage device 1200 may include one or more SSDs. When the storage device 1200 includes an SSD, the storage device 1200 may include a plurality of flash memory devices (e.g., NAND memory devices) that may store data. The storage device 1200 may be implemented in at least one of the semiconductor package 10 and the semiconductor package 10A described with reference to FIGS. 1A, 1B, 2, and 5.

The storage device 1200 may correspond to a flash memory device including one or more flash memory devices. In an embodiment, the storage device 1200 may be and/or may include memory embedded in the storage system 1000. For example, the storage device 1200 may be and/or may include, but not be limited to, an embedded multimedia card (EMMC), an embedded universal flash storage (UFS) memory device, and the like. In an embodiment, the storage device 1200 may be and/or may include external memory attachable/detachable to/from the storage system 1000. For example, the storage device 1200 may be and/or may include, but not be limited to, a UFS memory card, a compact flash (CF) card, a secure digital (SD) card, a micro-SD card, a mini-SD card, an extreme digital (xD) card, a memory stick, and the like.

The host 1100 and the storage device 1200 may communicate with each other through various interfaces. For example, the storage device 1200 may exchange a signal SIG with the host 1100 through a signal connector 1201. Alternatively or additionally, the storage device 1200 may receive an input power PWR through a power connector 1202.

In an embodiment, the host 1100 may transmit requests such as, but not limited to, a read request and a program request to the storage device 1200. Alternatively or additionally, the host 1100 and the storage device 1200 may exchange signals, messages, and the like that conform with one or more memory storage standards, such as, but not limited to, Toggle and/or open NAND flash interface (ONFI). For example, the signals SIG transmitted and/or received through the signal connector 1201 may conform with various interfaces, such as, but not limited to, a universal serial bus (USB) interface, a multimedia card (MMC) interface, an embedded MMC (eMMC) interface, a peripheral component interconnection (PCI) interface, a PCI express (PCIe) interface, an advanced technology attachment (ATA) interface, a serial ATA (SATA) interface, a parallel ATA (PATA) interface, a small computer system interface (SCSI), an enhanced small disk interface (ESDI), an integrated drive electronics (IDE) interface, a FireWire interface, a universal flash storage (UFS) interface, a non-volatile memory (NVM) express (NVMe) interface, and the like. In an optional or additional embodiment, the host 1100 may be implemented as an application processor (AP) or a system-on-a-chip (SoC).

The storage device 1200 may include a storage controller 1210 (e.g., an SSD controller), a plurality of memory devices (e.g., first NVM 1221, second NVM 1222, . . . , and n-th NVM 122*n*, where n is a positive integer greater than zero (0), and hereinafter generally referred to as 1220), buffer memory 1240, and an auxiliary power supply 1230. The storage controller 1210 may control the operation of the plurality of memory devices 1220 through a channel.

Each memory device of the plurality of memory devices 1220 may be and/or may include a semiconductor chip and/or a semiconductor die. Each memory device of the plurality of memory devices 1220 may be connected to a corresponding channel. In an embodiment, each memory device of the plurality of memory devices 1220 may be and/or may include a memory chip (e.g., memory chip 230 of FIGS. 2 and 5) included in the memory package 200 described with reference to FIGS. 1A and 1B.

Each memory device of the plurality of memory devices 1220 may be and/or may include a memory cell array. In an embodiment, the memory cell array may include flash memory cells. For example, the flash memory cells may be NAND flash memory cells. However, the present disclosure is not limited thereto, and the flash memory cells may be and/or may include other types of memory cells such as, but not limited to, resistive memory cells (e.g., ReRAM, PRAM, and MRAM).

The storage controller 1210 may read data stored in the plurality of memory devices 1220 in response to a read request received from the host 1100. Alternatively or additionally, the storage controller 1210 may write data to the plurality of memory devices 1220 in response to a write request received from the host 1100.

The auxiliary power supply 1230 may be connected with the host 1100 through the power connector 1202. The auxiliary power supply 1230 may receive an input power PWR from the host 1100. In an embodiment, the storage device 1200 may be powered and/or charged with the input power PWR received through the auxiliary power supply 1230. The auxiliary power supply 1230 may generate an internal power voltage based on the input power PWR. For example, the auxiliary power supply 1230 may provide an internal power voltage to the storage controller 1210 and/or the plurality of memory devices 1220. In an optional or additional embodiment, the auxiliary power supply 1230 may include a PMIC and/or a voltage regulator.

The buffer memory 1240 may temporarily store data to be written to the plurality of memory devices 1220. Alternatively or additionally, the buffer memory 1240 may store data read from the plurality of memory devices 1220. In an embodiment, the buffer memory 1240 may be provided in the storage controller 1210. Alternatively or additionally, the buffer memory 1240 may be arranged outside the storage controller 1210.

In an embodiment, the buffer memory 1240 may be and/or may include a DRAM. However, the present disclosure is not limited thereto, and the buffer memory 1240 may be implemented as SRAM, PRAM, and/or flash memory.

Each of the storage controller 1210, the auxiliary power supply 1230, and the buffer memory 1240 may be a driving chip (e.g., driving chip 330 of FIGS. 2 and 5) included in the driving chip package 300 described with reference to FIGS. 1A and 1B.

The storage device 1200 included in the storage system 1000 may include a dummy package arranged in a region where the plurality of memory devices 1220 are arranged. In an embodiment, the dummy package may have a substantially similar and/or the same size as that of a memory package in which each memory device of the plurality of memory devices 1220 is implemented. In an optional or additional embodiment, heat generated in the plurality of memory devices 1220, the storage controller 1210, the auxiliary power supply 1230, and the buffer memory 1240 may be dissipated to the outside of the storage device 1200 through the dummy package, and thereby, deterioration of the storage device 1200 may be prevented.

Figure 9:
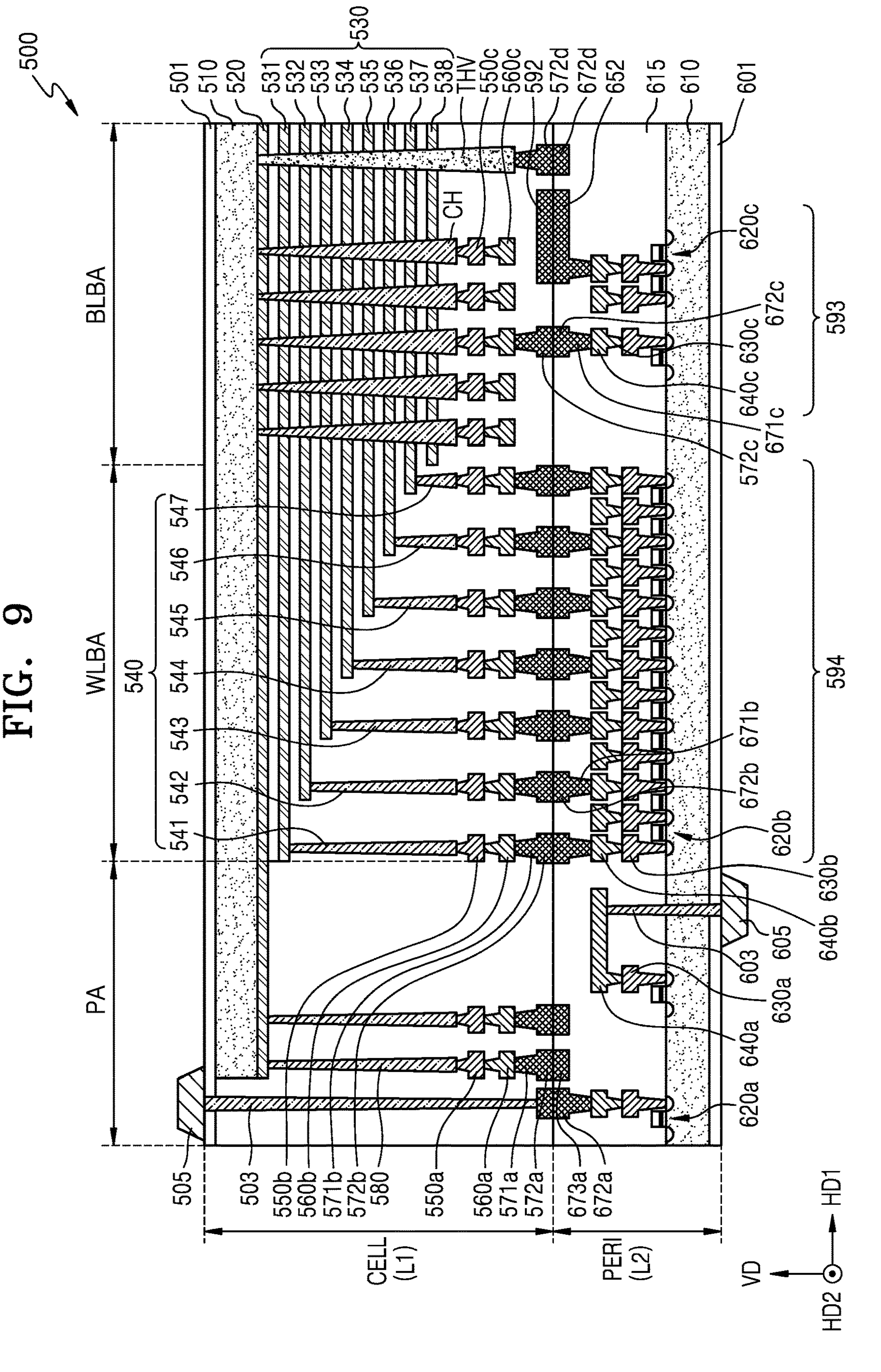
FIG. 9 is an example of a memory device implemented in a memory package included in a semiconductor package, according to an embodiment.

FIG. 9 is an example of a memory device implemented in a memory package included in a semiconductor package, according to an embodiment. FIG. 9 is a cross-sectional view of a memory device 500 having a bonding vertical NAND (B-VNAND) structure. For example, when non-volatile memory included in a memory device implemented in a memory package is implemented as B-VNAND type flash memory, the non-volatile memory may have a structure as shown in FIG. 9.

Referring to FIG. 9, a cell region CELL of the memory device 500 may correspond to a first semiconductor layer L1, and a peripheral circuit region PERI may correspond to a second semiconductor layer L2. In an embodiment, a memory cell array including a plurality of memory cells may be formed in the cell region CELL, and a peripheral circuit including a page buffer circuit, a row decoder, a control logic circuit, and a voltage generator may be formed in the peripheral circuit region PERI.

Each of the peripheral circuit region PERI and the cell region CELL of the memory device 500 may include an external pad bonding region PA, a word line bonding region WLBA, and a bit line bonding region BLBA.

The peripheral circuit region PERI may include a first substrate 610, an interlayer insulating layer 615, a plurality of circuit devices (e.g., 620*a*, 620*b*, and 620*c*) formed on the first substrate 610, first metal layers (e.g., 630*a*, 630*b*, and 630*c*) respectively connected to the plurality of circuit devices 620*a* to 620*c*, and second metal layers (e.g., 640*a*, 640*b*, and 640*c*) formed on the first metal layers 630*a* to 630*c*. In an embodiment, the first metal layers 630*a* to 630*c* may be formed of tungsten (W) and/or a similar material having a relatively high resistance. Alternatively or additionally, the second metal layers 640*a* to 640*c* may be formed of copper (Cu) and/or a similar material having a relatively low resistance.

Although FIG. 9 depicts the first metal layers 630*a* to 630*c* and the second metal layers 640*a* to 640*c*, the present disclosure is not limited thereto, and at least one metal layer may be additionally formed on the first metal layers 630*a* to 630*c* and/or the second metal layers 640*a* to 640*c*. Alternatively or additionally, at least some of one or more metal layers formed above the second metal layers 640*a* to 640*c* may be formed of aluminum (Al) and/or a similar material having a lower resistance than the material (e.g., Cu) forming the second metal layers 640*a* to 640*c*.

The interlayer insulating layer 615 may be disposed on the first substrate 610 to cover at least a portion of the plurality of circuit devices 620*a* to 620*c*, the first metal layers 630*a* to 630*c*, and the second metal layers 640*a* to 640*c*. Alternatively or additionally, the interlayer insulating layer 615 may include an insulating material such as, but not limited to, silicon oxide (SiO) and/or silicon nitride (SiN).

In an embodiment, lower bonding metals 671*b* and 672*b* may be formed on the second metal layer 640*b* of the word line bonding region WLBA. In the word line bonding region WLBA, the lower bonding metals 671*b* and 672*b* of the peripheral circuit region PERI may be electrically connected with upper bonding metals 571*b* and 572*b* of the cell region CELL by a bonding method. Alternatively or additionally, the lower bonding metals 671*b* and 672*b* and the upper bonding metals 571*b* and 572*b* may be formed of aluminum (Al), copper (Cu), tungsten (W), or the like.

The cell region CELL may provide at least one memory block. The cell region CELL may include a second substrate 510 and a common source line 520. A plurality of word lines (e.g., word lines 531 to 538, and hereinafter generally referred to as 530) may be stacked on the second substrate 510 in a vertical direction VD with respect to an upper surface of the second substrate 510. String selection lines and a ground selection line may be disposed respectively above and under the plurality of word lines 530. Alternatively or additionally, the plurality of word lines 530 may be arranged between the string selection lines and the ground selection line.

In the bit line bonding region BLBA, a channel structure CH may extend in the vertical direction VD. Alternatively or additionally, the channel structure CH may pass through the plurality of word lines 530, the string selection lines, and the ground selection line. The channel structure CH may include a data storage layer, a channel layer, and a buried insulating layer. Alternatively or additionally, the channel layer may be electrically connected with a first metal layer and a second metal layer. For example, the first metal layer may be a bit line contact 550*c*, and the second metal layer may be a bit line 560*c*. In an embodiment, the bit line 560*c* may extend in a second horizontal direction HD2 parallel to the upper surface of the second substrate 510.

In an embodiment, a region in which the channel structure CH, the bit line 560*c*, and the like are arranged may be referred to as the bit line bonding region BLBA. The bit line 560*c* may be electrically connected with the circuit devices 620*c* that provide a page buffer 593 of the peripheral circuit region PERI, in the bit line bonding region BLBA. For example, the bit line 560*c* may be connected with an upper bonding metal 572*c* of the cell region CELL. Alternatively or additionally, the upper bonding metal 572*c* may be connected with lower bonding metals 671*c* and 672*c* connected to the circuit devices 620*c* of the page buffer 593. Accordingly, the page buffer 593 may be connected to the bit line 560*c* through the upper bonding metal 572*c* and the lower bonding metals 671*c* and 672*c*.

The memory device 500 may further include a through electrode THV arranged in the bit line bonding region BLBA. The through electrode THV may pass through the plurality of word lines 530, and thus, may extend in the vertical direction VD.

In the word line bonding region WLBA, the plurality of word lines 530 may extend in a first horizontal direction HD1 parallel to the upper surface of the second substrate 510 and may be connected with a plurality of cell contact plugs (e.g., cell contact plugs 541 to 547, and hereinafter generally referred to as 540). The plurality of word lines 530 and the plurality of cell contact plugs 540 may be connected with each other at pads provided by extending at least some of the plurality of word lines 530 in different lengths in the vertical direction VD. A first metal layer 550*b* and a second metal layer 560*b* may be sequentially connected to upper portions of the plurality of cell contact plugs 540 connected to the plurality of word lines 530. The plurality of cell contact plugs 540 may be connected with the peripheral circuit region PERI through the upper bonding metals 571*b* and 572*b* of the cell region CELL and the lower bonding metals 671*b* and 672*b* of the peripheral circuit region PERI, in the word line bonding region WLBA.

The plurality of cell contact plugs 540 may be electrically connected with the circuit devices 620*b* that provide a row decoder 594 in the peripheral circuit region PERI. In an embodiment, an operating voltage of the circuit devices 620*b* that provide the row decoder 594 may be different from an operating voltage of the circuit devices 620*c* that provide the page buffer 593. For example, an operating voltage of the circuit devices 620*c* that provide the page buffer 593 may be greater than an operating voltage of the circuit devices 620*b* that provide the row decoder 594.

A common source line contact plug 580 may be arranged in the external pad bonding region PA. The common source line contact plug 580 may be formed of a conductive material such as, but not limited to, a metal, a metal compound, a polysilicon, and the like. Alternatively or additionally, the common source line contact plug 580 may be electrically connected with the common source line 520. A first metal layer 550*a* and a second metal layer 560*a* may be sequentially stacked above the common source line contact plug 580. For example, a region in which the common source line contact plug 580, the first metal layer 550*a*, and the second metal layer 560*a* are arranged may be referred to as the external pad bonding region PA.

In an embodiment, a first input/output pad 605 and a second input/output pad 505 may be arranged in the external pad bonding region PA. A lower insulating film 601 covering at least a portion of a lower surface of the first substrate 610 may be formed under the first substrate 610, and the first input/output pad 605 may be formed on the lower insulating film 601. The first input/output pad 605 may be connected with at least one of the plurality of circuit devices 620*a* to 620*c* arranged in the peripheral circuit region PERI through a first input/output contact plug 603. Alternatively or additionally, the first input/output pad 605 may be separated from the first substrate 610 by the lower insulating film 601. In an optional or additional embodiment, a side insulating film may be arranged between the first input/output contact plug 603 and the first substrate 610 to electrically separate the first input/output contact plug 603 from the first substrate 610.

An upper insulating film 501 covering at least a portion of the upper surface of the second substrate 510 may be formed above the second substrate 510. Alternatively or additionally, the second input/output pad 505 may be disposed on the upper insulating film 501. The second input/output pad 505 may be connected with at least one of the plurality of circuit devices 620*a* to 620*c* arranged in the peripheral circuit region PERI through a second input/output contact plug 503.

According to an embodiment, the second substrate 510, the common source line 520, and the like may not be arranged in a region in which the second input/output contact plug 503 is arranged. Alternatively or additionally, the second input/output pad 505 may not overlap the plurality of word lines 530 in a third direction (e.g., a vertical direction VD). The second input/output contact plug 503 may be separated from the second substrate 510 in a direction parallel to the upper surface of the second substrate 510, and may pass through an interlayer insulating layer of the cell region CELL and thus be connected to the second input/output pad 505.

According to embodiments, the first input/output pad 605 and the second input/output pad 505 may be selectively formed. For example, the memory device 500 may include only the first input/output pad 605 disposed above the first substrate 610 and/or may include only the second input/output pad 505 disposed above the second substrate 510. Alternatively or additionally, the memory device 500 may include both the first input/output pad 605 and the second input/output pad 505.

A metal pattern of the uppermost metal layer may exist as a dummy pattern in each of the external pad bonding region PA and the bit line bonding region BLBA included in each of the cell region CELL and the peripheral circuit region PERI, or the uppermost metal layer may be empty.

In the memory device 500, in the external pad bonding region PA, a lower metal pattern 673*a* having a substantially similar and/or the same shape as that of an upper metal pattern 572*a* may be formed on the uppermost metal layer of the peripheral circuit region PERI to correspond to the upper metal pattern 572*a* formed on the uppermost metal layer of the cell region CELL. The lower metal pattern 673*a* formed on the uppermost metal layer of the peripheral circuit region PERI may not be connected with a separate contact in the peripheral circuit region PERI. Similarly, in the external pad bonding region PA, an upper metal pattern having a substantially similar and/or the same shape as that of a lower metal pattern of the peripheral circuit region PERI may be formed on an upper metal layer of the cell region CELL to correspond to the lower metal pattern formed on the uppermost metal layer of the peripheral circuit region PERI.

The lower bonding metals 671*b* and 672*b* may be formed on the second metal layer 640*b* of the word line bonding region WLBA. In the word line bonding region WLBA, the lower bonding metals 671*b* and 672*b* of the peripheral circuit region PERI may be electrically connected with the upper bonding metals 571*b* and 572*b* of the cell region CELL by a bonding method.

Alternatively or additionally, in the bit line bonding region BLBA, an upper metal pattern 592 having a substantially similar and/or the same shape as that of a lower metal pattern 652 may be formed on the uppermost metal layer of the cell region CELL to correspond to the lower metal pattern 652 formed on the uppermost metal layer of the peripheral circuit region PERI. A contact may not be formed on the upper metal pattern 592 formed on the uppermost metal layer of the cell region CELL.

While the present disclosure has been particularly shown and described with reference to embodiments thereof, it will be understood that various changes in form and details may be made therein without departing from the spirit and scope of the following claims.

What is claimed is:

1. A semiconductor package, comprising:

a solid-state drive (SSD) device comprising:

a printed circuit board comprising a memory region;

a plurality of memory packages disposed on the memory region; and at least one dummy package disposed on the memory region, wherein the at least one dummy package is electrically coupled with the printed circuit board, and wherein the at least one dummy package comprises:

a first pad constituting a heat path through which heat of the printed circuit board is dissipated:

a second pad; and a metal layer electrically coupled with the first pad and electrically separated from the second pad, the metal layer constituting the heat path.

2. The semiconductor package of claim 1, wherein the at least one dummy package further comprises:

a polished layer on the metal layer.

3. The semiconductor package of claim 2, wherein the SSD further comprises:

a first adhesive layer in contact with the plurality of memory packages;

a second adhesive layer in contact with the polished layer of the at least one dummy package; and a package case attached to the first adhesive layer and the second adhesive layer.

4. The semiconductor package of claim 3, wherein:

at least one memory package of the plurality of memory packages is mounted on a first surface of the printed circuit board, the at least one dummy package is mounted on the first surface of the printed circuit board, and a first thickness of the first adhesive layer matches a second thickness of the second adhesive layer.

5. The semiconductor package of claim 1, wherein the metal layer comprises a heat sink.

6. The semiconductor package of claim 1, wherein:

the at least one dummy package is mounted on the printed circuit board through a plurality of bumps, the at least one dummy package further comprises a plurality of pads in contact with the plurality of bumps, respectively, and the plurality of pads comprise the first pad and the second pad.

7. The semiconductor package of claim 1, wherein the printed circuit board further comprises:

a wiring pattern electrically coupled with the first pad and constituting the heat path; and an insulating layer surrounding the wiring pattern, wherein the wiring pattern is configured to receive an applied ground voltage.

8. The semiconductor package of claim 1, wherein the printed circuit board further comprises:

a wiring pattern electrically coupled with the first pad and constituting the heat path; and an insulating layer surrounding the wiring pattern, wherein the wiring pattern is electrically separated from input/output signals of the plurality of memory packages.

9. The semiconductor package of claim 1, wherein the SSD further comprises:

a driving chip package electrically coupled with the first pad and disposed on a region other than the memory region of the printed circuit board.

10. A semiconductor package, comprising:

a printed circuit board comprising a first surface and a second surface opposite to the first surface;

a dummy package mounted on the first surface; and a memory package aligned with the dummy package in a direction perpendicular to the first surface and the second surface and mounted on the second surface, wherein the dummy package comprises:

a first pad electrically coupled with the printed circuit board;

a second pad; and a metal layer electrically coupled with the first pad and electrically separated from the second pad.

11. The semiconductor package of claim 10, wherein the memory package comprises a NAND flash memory device.

12. The semiconductor package of claim 10, wherein the dummy package further comprises a polished layer disposed on the metal layer.

13. The semiconductor package of claim 12, further comprising:

a first adhesive layer in contact with the memory package;

a second adhesive layer in contact with the polished layer of the dummy package; and a package case attached to the first adhesive layer and the second adhesive layer.

14. The semiconductor package of claim 10, wherein:

the metal layer comprises a heat sink structure, and the metal layer is exposed to air.

15. The semiconductor package of claim 10, wherein:

the dummy package is mounted on the printed circuit board through a plurality of bumps, the dummy package further comprises a plurality of pads in contact with the plurality of bumps, respectively, and the plurality of pads comprise the first pad and the second pad.

16. The semiconductor package of claim 10, wherein the printed circuit board further comprises:

a wiring pattern electrically coupled with the first pad; and an insulating layer surrounding the wiring pattern, wherein the wiring pattern is configured to receive an applied ground voltage.

17. A semiconductor package, comprising:

a printed circuit board comprising a first surface and a second surface opposite to the first surface;

a dummy package mounted on the first surface;

a memory package aligned with the dummy package in a direction perpendicular to the first surface and the second surface and mounted on the second surface; and a driving package mounted on at least one of the first surface and the second surface, wherein a driving circuit configured to drive a memory chip of the memory package is formed on the at least one of the first surface and the second surface, wherein the dummy package is electrically coupled with the printed circuit board through a bump, wherein the dummy package comprises:

a first pad constituting a heat path through which heat of the printed circuit board is dissipated;

a second pad; and a metal layer electrically coupled with the first pad and electrically separated from the second pad, the metal layer constituting the heat path, wherein the memory package comprises a NAND flash memory device, and wherein the driving circuit of the driving package comprises a storage controller configured to control the NAND flash memory device.

18. The semiconductor package of claim 17, wherein the dummy package further comprises:

a polished layer disposed on the metal layer.

19. The semiconductor package of claim 17, wherein the metal layer comprises a heat sink structure.

20. The semiconductor package of claim 17, wherein:

the printed circuit board further comprises a wiring pattern electrically coupled with the first pad, wherein the wiring pattern constitutes the heat path, and wherein the wiring pattern is configured to receive an applied ground voltage.

* * * * *